United States Patent
Pendse

(10) Patent No.: US 9,484,319 B2
(45) Date of Patent: Nov. 1, 2016

(54) SEMICONDUCTOR DEVICE AND METHOD OF FORMING EXTENDED SEMICONDUCTOR DEVICE WITH FAN-OUT INTERCONNECT STRUCTURE TO REDUCE COMPLEXITY OF SUBSTRATE

(75) Inventor: Rajendra D. Pendse, Fremont, CA (US)

(73) Assignee: STATS ChipPAC Pte. Ltd., Singapore (SG)

( * ) Notice: Subject to any disclaimer, the term of this patent is extended or adjusted under 35 U.S.C. 154(b) by 333 days.

(21) Appl. No.: 13/336,860

(22) Filed: Dec. 23, 2011

(65) Prior Publication Data
US 2013/0161833 A1 Jun. 27, 2013

(51) Int. Cl.
*H01L 23/48* (2006.01)
*H01L 23/52* (2006.01)
*H01L 29/40* (2006.01)
(Continued)

(52) U.S. Cl.
CPC .......... *H01L 24/20* (2013.01); *H01L 21/4846* (2013.01); *H01L 23/49816* (2013.01); *H01L 23/5389* (2013.01); *H01L 24/19* (2013.01); *H01L 24/96* (2013.01); *H01L 24/97* (2013.01); *H01L 21/568* (2013.01); *H01L 2224/0401* (2013.01); *H01L 2224/04105* (2013.01); *H01L 2224/12105* (2013.01); *H01L 2224/16227* (2013.01); *H01L 2224/32245* (2013.01); *H01L 2224/73267* (2013.01); *H01L 2224/9222* (2013.01); *H01L 2924/01322* (2013.01); *H01L 2924/10253* (2013.01); *H01L 2924/12041* (2013.01); *H01L 2924/12042* (2013.01); *H01L 2924/1306* (2013.01); *H01L 2924/13091* (2013.01); *H01L 2924/15311* (2013.01); *H01L 2924/181* (2013.01); *H01L 2924/18162* (2013.01); *H01L 2924/19105* (2013.01)

(58) Field of Classification Search
CPC ... H01L 23/538; H01L 24/10; H01L 23/488; H01L 24/82; H01L 24/14; H01L 24/17; H01L 24/18; H01L 2924/15321; H01L 2924/15331
USPC ....... 257/777, 778, 723, 686, 737, 738, 783, 257/774, 790, 678, 787; 438/106, 108, 109, 438/110, 118, 127, 613, 614
See application file for complete search history.

(56) References Cited

U.S. PATENT DOCUMENTS 7,045,899 B2 * 5/2006 Yamane et al. ............... 257/777
7,838,975 B2   11/2010 Chen
(Continued)

*Primary Examiner* — Thanh Y Tran
(74) *Attorney, Agent, or Firm* — Robert D. Atkins; Patent Law Group: Atkins and Associates, P.C.

(57) ABSTRACT

A semiconductor device has a semiconductor wafer with a plurality of semiconductor die. Contact pads are formed on a surface of the semiconductor die. The semiconductor die are separated to form a peripheral region around the semiconductor die. An encapsulant or insulating material is deposited in the peripheral region around the semiconductor die. An interconnect structure is formed over the semiconductor die and insulating material. The interconnect structure has an I/O density less than an I/O density of the contact pads on the semiconductor die. A substrate has an I/O density consistent with the I/O density of the interconnect structure. The semiconductor die is mounted to the substrate with the interconnect structure electrically connecting the contact pads of the semiconductor die to the first conductive layer of the substrate. A plurality of semiconductor die each with the interconnect structure can be mounted over the substrate.

17 Claims, 16 Drawing Sheets

(51) Int. Cl.
*H01L 23/00* (2006.01)
*H01L 23/498* (2006.01)
*H01L 21/48* (2006.01)
*H01L 23/538* (2006.01)
*H01L 21/56* (2006.01)

(56) References Cited

U.S. PATENT DOCUMENTS

| | | | |
|---|---|---|---|
| 8,093,722 | B2 | 1/2012 | Chen et al. |
| 8,310,051 | B2 | 11/2012 | Chen et al. |
| 2002/0132463 | A1* | 9/2002 | Urushima ............ 438/613 |
| 2007/0262436 | A1* | 11/2007 | Kweon et al. ............ 257/686 |
| 2009/0294938 | A1* | 12/2009 | Chen ............ H01L 23/3128 257/676 |
| 2010/0084754 | A1* | 4/2010 | Yoo et al. ............ 257/686 |
| 2010/0148359 | A1* | 6/2010 | Quevedo et al. ............ 257/725 |
| 2010/0314780 | A1* | 12/2010 | Camacho et al. ............ 257/777 |
| 2011/0024888 | A1* | 2/2011 | Pagaila et al. ............ 257/686 |
| 2011/0031619 | A1* | 2/2011 | Chen ............ H01L 21/563 257/738 |
| 2012/0049352 | A1* | 3/2012 | Kang et al. ............ 257/737 |
| 2012/0056321 | A1* | 3/2012 | Pagaila ............ 257/737 |
| 2012/0126395 | A1* | 5/2012 | Lee et al. ............ 257/737 |
| 2012/0211885 | A1* | 8/2012 | Choi et al. ............ 257/737 |
| 2013/0093097 | A1* | 4/2013 | Yu et al. ............ 257/774 |

* cited by examiner

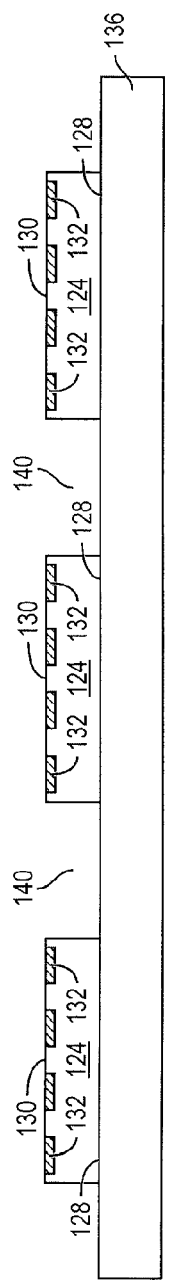
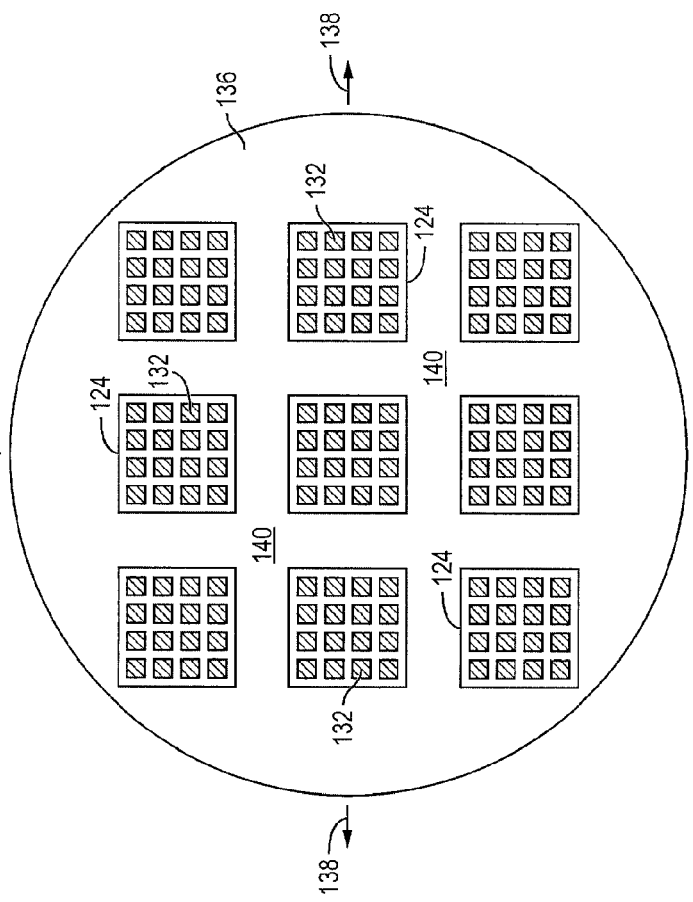
FIG. 4d
FIG. 4e

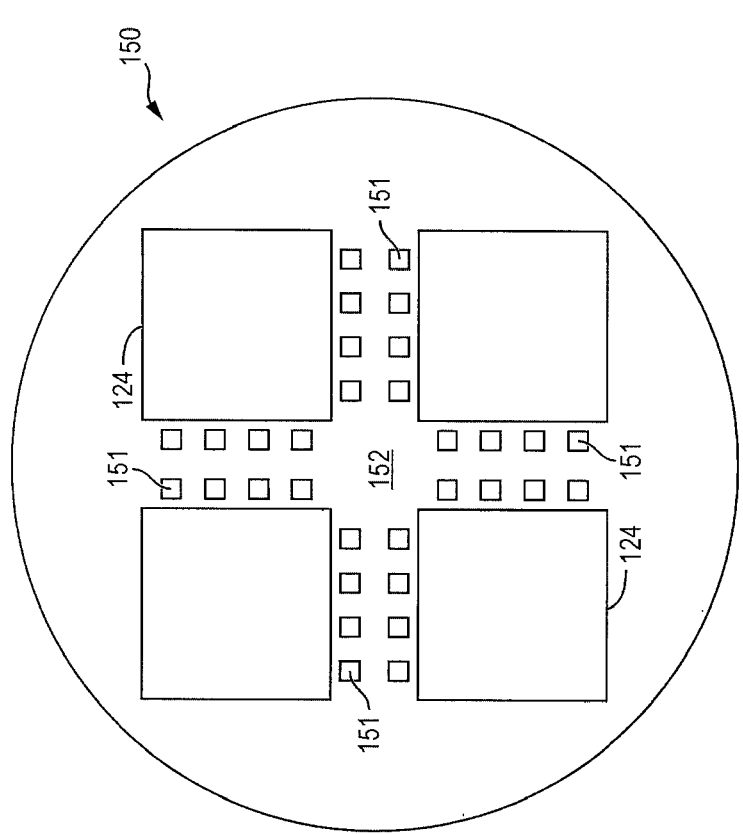
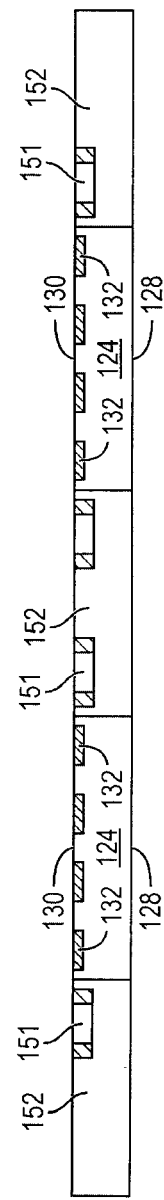
FIG. 4k
FIG. 4l

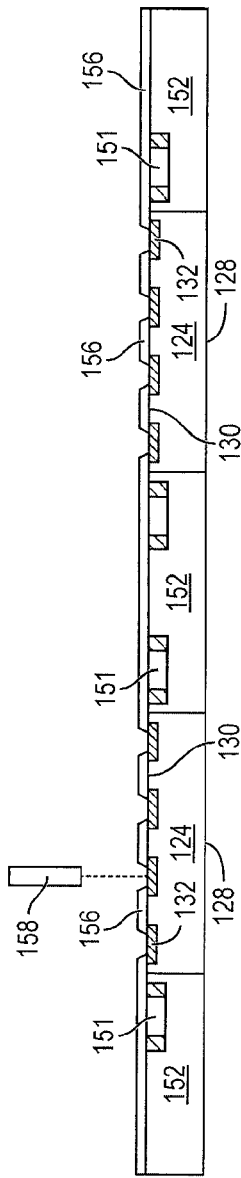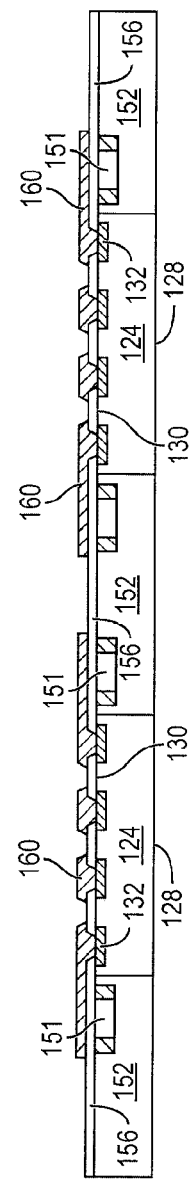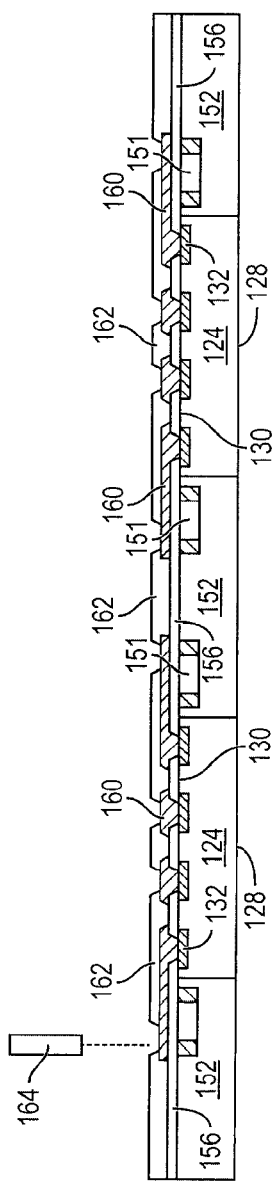

SEMICONDUCTOR DEVICE AND METHOD OF FORMING EXTENDED SEMICONDUCTOR DEVICE WITH FAN-OUT INTERCONNECT STRUCTURE TO REDUCE COMPLEXITY OF SUBSTRATE

FIELD OF THE INVENTION

The present invention relates in general to semiconductor devices and, more particularly, to a semiconductor device and method of forming an extended semiconductor device with a fan-out interconnect structure to reduce complexity of a substrate.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A conventional flipchip type semiconductor die 10 is shown in FIG. 1 with bumps 12 formed on contact pads 14 over active surface 16. Contact pads 14 are laid out in a given pattern having a density and pitch as determined by the input/output (I/O) requirements of the active and passive components in semiconductor die 10. The size of semiconductor die 10 is determined by the electrical functionality of the die and the I/O required for interconnect to the active and passive components of the die. In order to reduce die size and maximize the number of die per wafer, contact pads 14 are typically laid out according to the minimum pitch achievable for the manufacturing process. That is, contact pads 14 are placed as close together as allowed by the manufacturing process to achieve the highest I/O density and minimum possible pitch. In one embodiment, contact pads 14 have a pitch of 80 µm. By using the minimum pitch achievable for the manufacturing process for contact pads 14, semiconductor die 10 can meet the I/O requirements of the active and passive components of the die while minimizing the die size. In one embodiment, semiconductor die is 5.2×5.2 millimeter square (mm²).

Semiconductor die 10 is mounted to substrate 20 with bumps 12 metallurgically and electrically connected to conductive layer 22 formed on the substrate. Conductive layer 22 includes contact pads and trace lines for electrical interconnect through substrate 20. Conductive layer 22 on substrate 20 must be laid out with the same minimum pitch achievable for the manufacturing process, e.g., 80 µm, as used for contact pads 14. That is, the layout of conductive layer 22 has the same I/O density as contact pads 14. The high I/O density layout requirements for substrate 20 substantially increase the cost of the substrate and reduce flexibility in placing conductive layer 22.

In many applications, a plurality of discrete electrical components 24 is mounted to substrate 20. The discrete electrical components 24 require a minimum spacing from semiconductor die 10 to reduce adverse parasitic effects. Accordingly, discrete electrical components 24 are placed a minimum distance D from semiconductor die 10 on substrate 20 to avoid parasitic interference. The minimum spacing D between the discrete electrical components 24 and semiconductor die 10 consumes area on substrate 20 and complicates the routing of trace lines 22.

SUMMARY OF THE INVENTION

A need exists to relax the layout density rules of the substrate in order to reduce manufacturing cost. Accordingly, in one embodiment, the present invention is a method of making an extended semiconductor device comprising the steps of providing a semiconductor wafer having a plurality of semiconductor die with a plurality of contact pads formed on a surface of the semiconductor die, separating the semiconductor die to form a peripheral region around the semiconductor die, depositing an insulating material in the peripheral region around the semiconductor die, and forming an interconnect structure over the semiconductor die and insulating material. The interconnect structure has an I/O density less than an I/O density of the contact pads on the semiconductor die. The method further includes the steps of providing a substrate having an I/O density consistent with the I/O density of the interconnect structure, and mounting the semiconductor die to the substrate with the interconnect structure electrically connecting the contact pads of the semiconductor die to the first conductive layer of the substrate.

In another embodiment, the present invention is a method of making an extended semiconductor device comprising the steps of providing a semiconductor die having a plurality of contact pads formed on a surface of the semiconductor die, depositing an insulating material in a peripheral region around the semiconductor die, and forming an interconnect structure over the semiconductor die and insulating material. The interconnect structure has an I/O density less than an I/O density of the contact pads on the semiconductor die.

In another embodiment, the present invention is a method of making an extended semiconductor device comprising the steps of providing a first tier device having a first I/O density, forming an I/O density conversion structure over the first tier device, providing a second tier device having a second I/O density less than the first I/O density, and mounting the first tier device to the second tier device with the I/O density conversion structure electrically connecting the first tier device to the second tier device.

In another embodiment, the present invention is an extended semiconductor device comprising a semiconductor die having a plurality of contact pads formed on a surface of the semiconductor die. An insulating material is deposited in a peripheral region around the semiconductor die. An interconnect structure is formed over the semiconductor die and insulating material. The interconnect structure has an I/O density less than an I/O density of the contact pads on the semiconductor die.

DETAILED DESCRIPTION OF THE DRAWINGS

Figure 1:
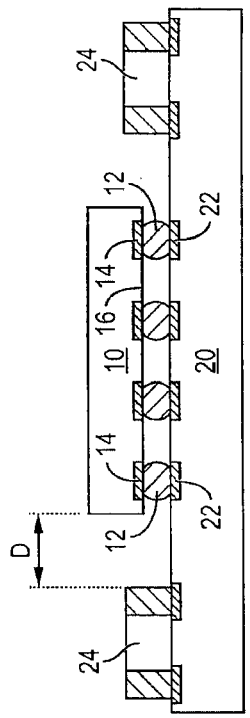
FIG. 1 illustrates a conventional flipchip type semiconductor die mounted to a substrate.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
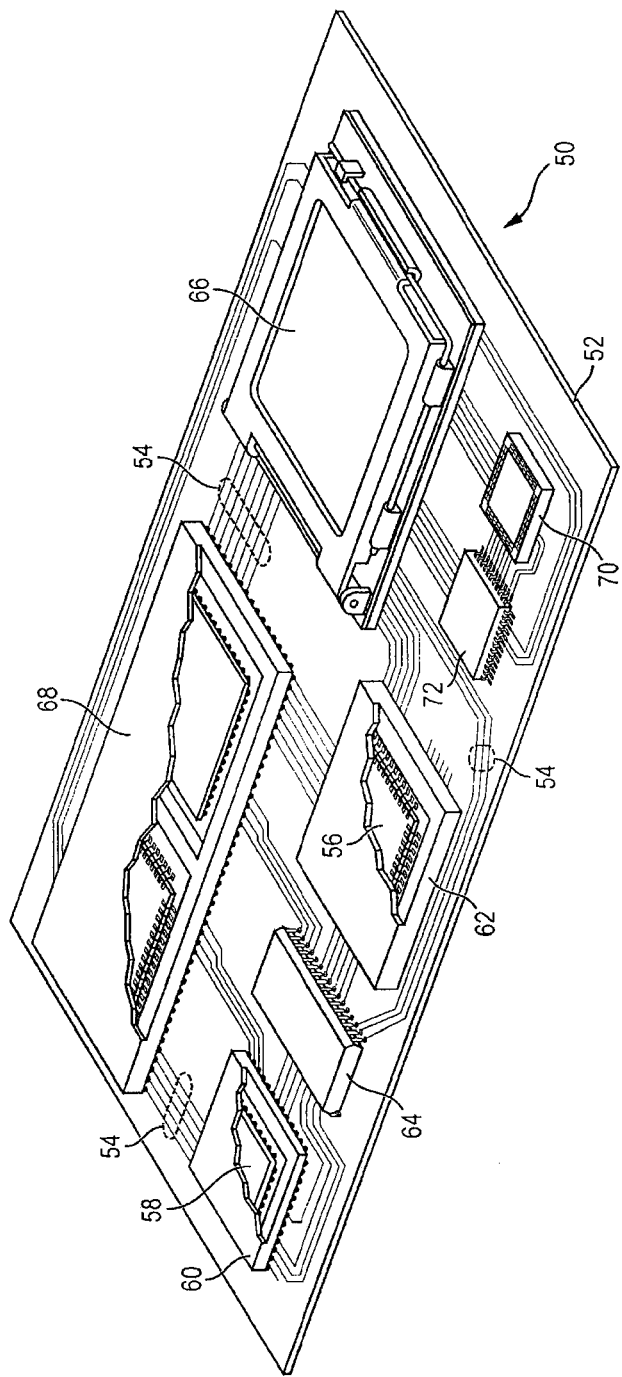
FIG. 2 illustrates a PCB with different types of packages mounted to its surface.

FIG. 2 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 2 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market.

The distance between semiconductor devices must be decreased to achieve higher density.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 3A:
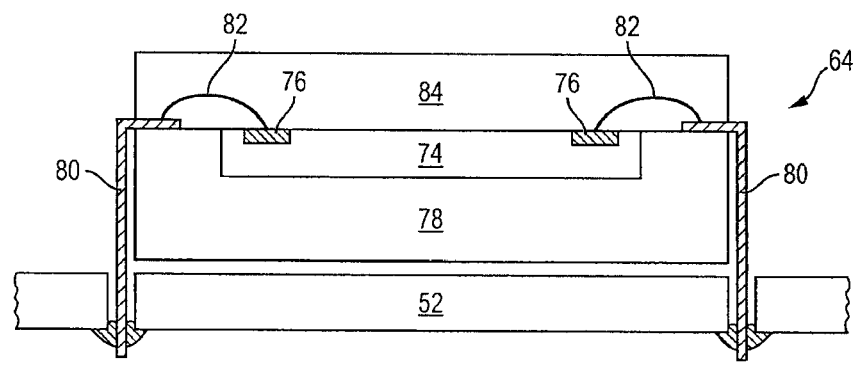
FIGS. 3a-3c illustrate further detail of the representative semiconductor packages mounted to the PCB.
Figure 3B:
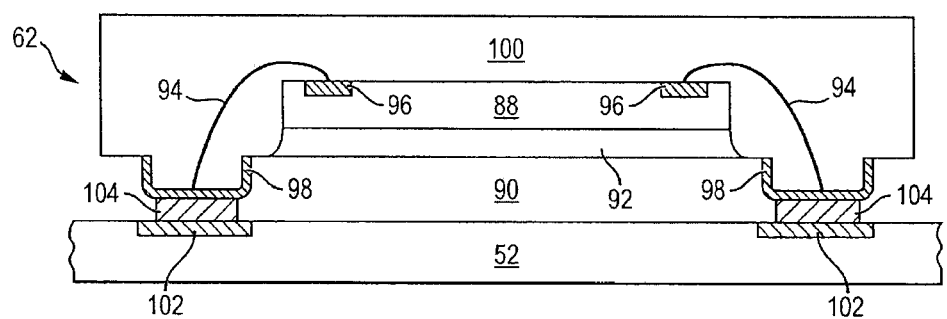
Figure 3C:
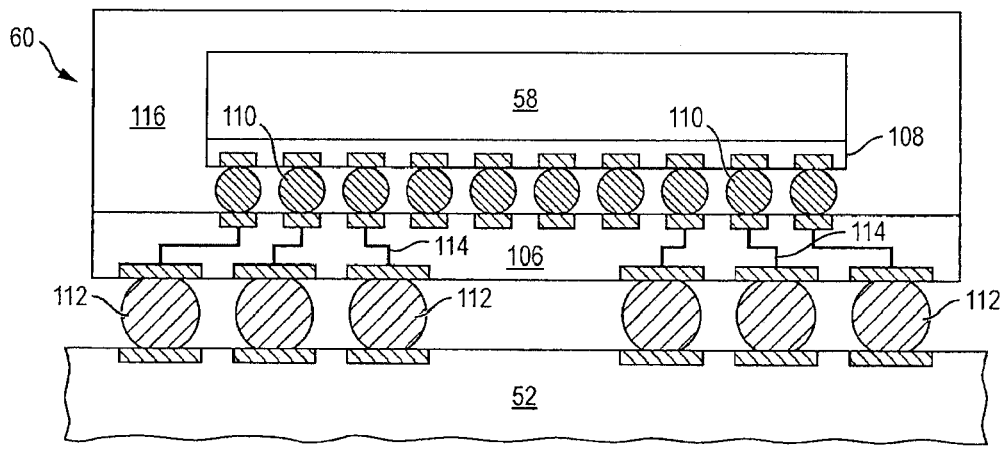

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 3b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 4A:
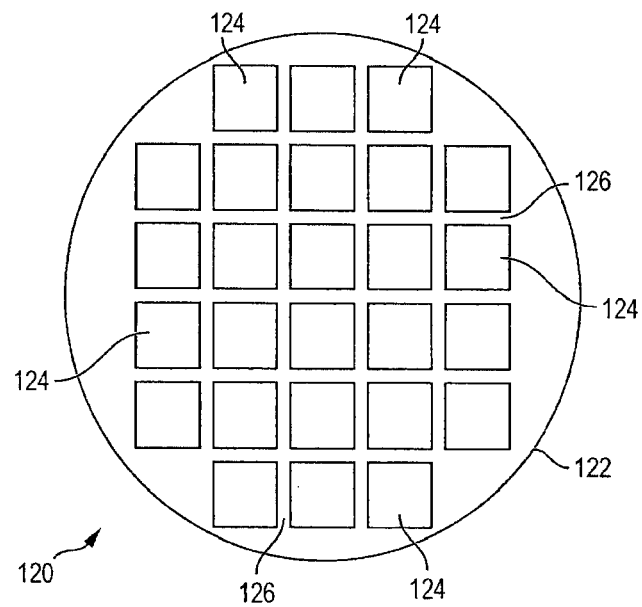
FIGS. 4a-4r illustrate a process of forming an extended semiconductor device with a fan-out interconnect structure to reduce complexity of a substrate.
Figure 4B:
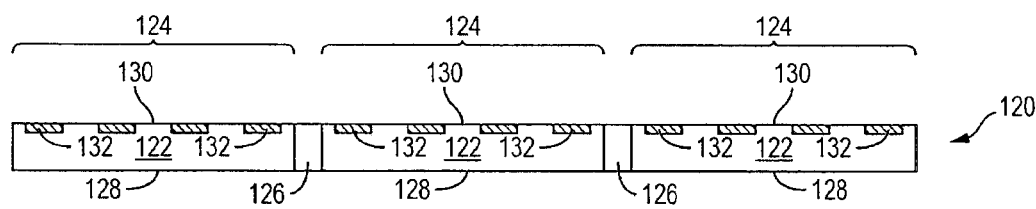
Figure 4C:
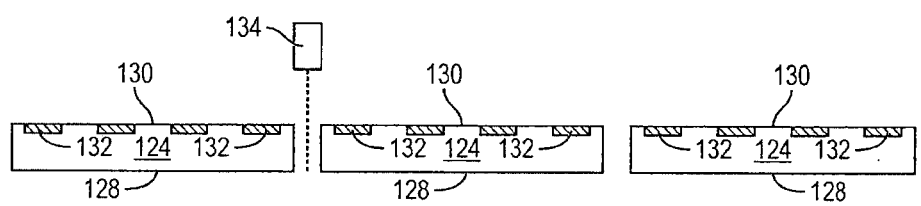
Figure 4F:
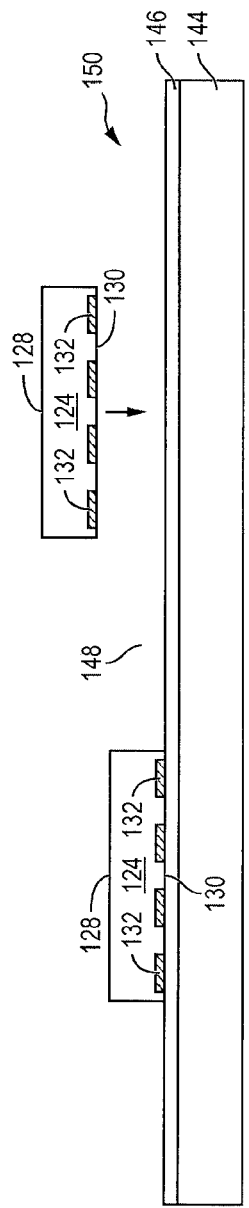
Figure 4G:
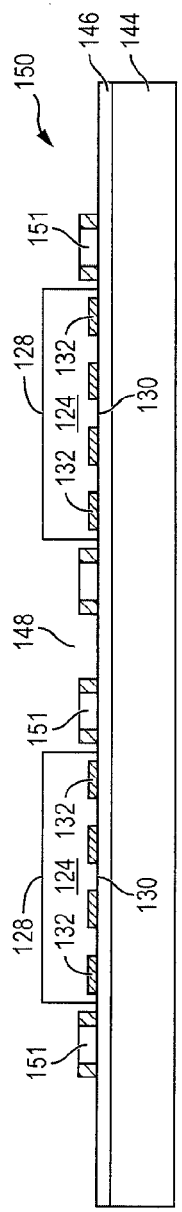
Figure 4H:
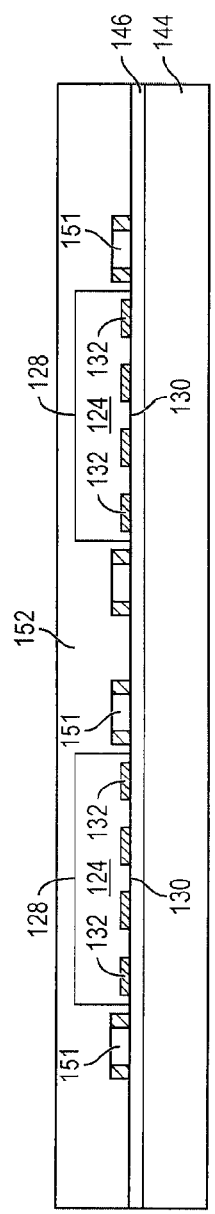
Figure 4I:
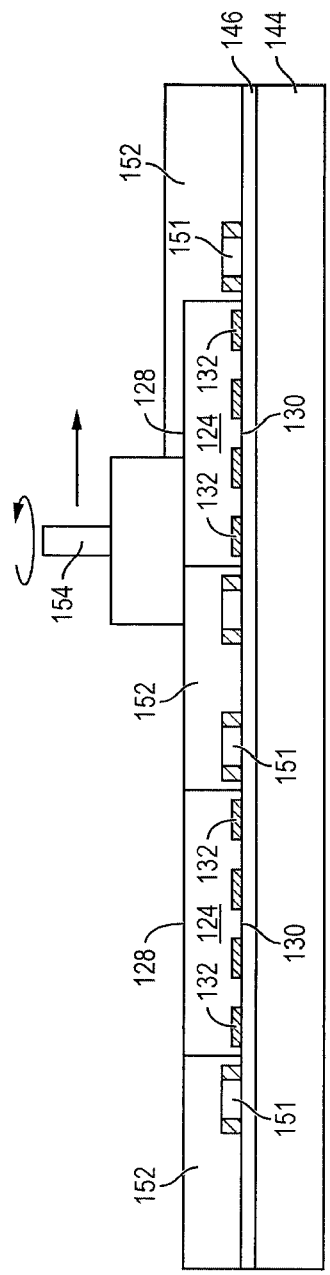
Figure 4J:
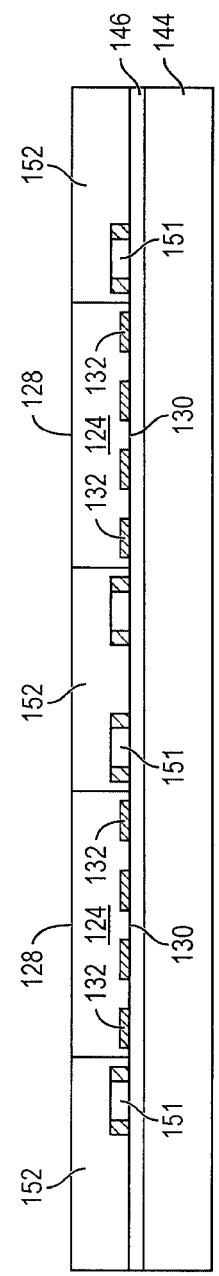
Figure 4P:
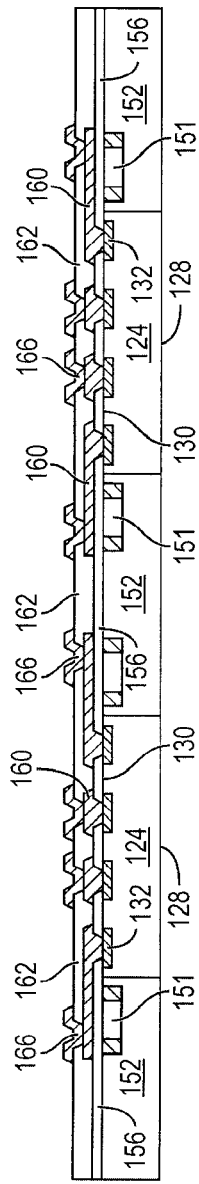
Figure 4Q:
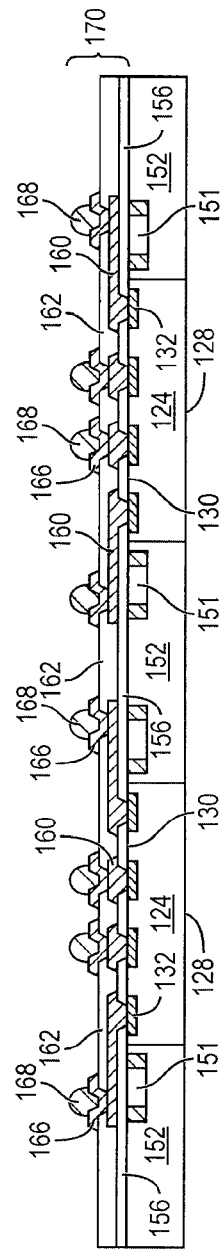
Figure 4R:
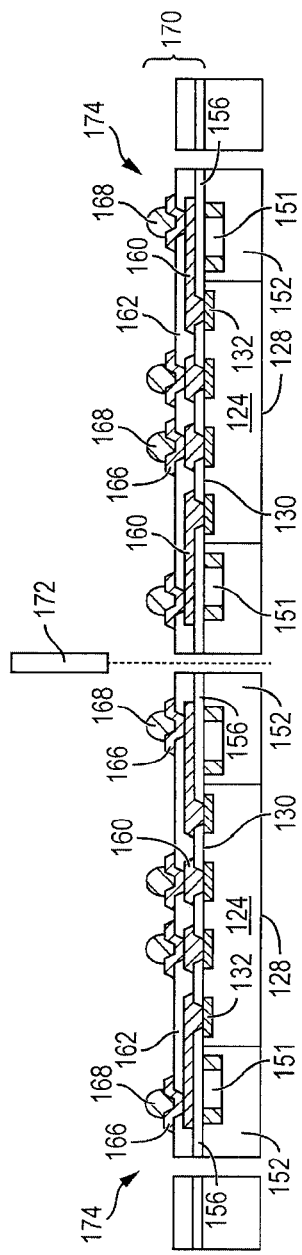

FIGS. 4a-4r illustrate, in relation to FIGS. 2 and 3a-3c, a process of forming an extended semiconductor device with a fan-out interconnect structure to reduce complexity of a substrate. FIG. 4a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

FIG. 4b shows a cross-sectional view of a portion of semiconductor wafer 120. Each semiconductor die 124 has a back surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. Each semiconductor die 124 has a given area as determined by its electrical functionality (number of active and passive components) and I/O requirements to provide interconnect to the active and passive components of the die. Semiconductor die 124 is a flipchip type die with dimensions ranging from 5.2×5.2 mm² to 25×25 mm².

An electrically conductive layer 132 is formed using a patterning and metal deposition process such as printing, PVD, CVD, sputtering, electrolytic plating, and electroless plating. Conductive layer 132 can be one or more layers of Al, Cu, Sn, Ti, Ni, Au, Ag, or other suitable electrically conductive material, including alloys thereof. Conductive layer 132 operates as contact pads that are electrically connected to the circuits on active surface 130 of semiconductor wafer 120. Conductive layer 132 can be disposed a first distance from the edge of semiconductor die 124, as shown in FIG. 4b. Alternatively, conductive layer 132 can be offset in multiple rows such that a first row of contact pads is disposed a first distance from the edge of the die, and a second row of contact pads alternating with the first row is disposed a second distance from the edge of the die. In one embodiment, conductive layer 132 can have a circular, rectangular, or other suitable shape.

Conductive layer 132 is laid out in a given pattern having an I/O density and pitch as determined by the I/O requirements to provide interconnect to the electrical components of semiconductor die 124. The size of semiconductor die 124 is determined by the electrical functionality of the die and the I/O required for interconnect to the active and passive components of the die. In order to reduce die size and maximize the number of die per wafer, conductive layer 132 is typically laid out according to the minimum pitch achievable for the manufacturing process. In one embodiment, conductive layer 132 is arranged as an inner grid with a pitch of 100-500 μm. In addition, one or more outer rows of conductive layer 132 is arranged around the inner grid. The outer rows of conductive layer 132 may have a pitch of 40-150 μm. By using the minimum pitch achievable for the manufacturing process for conductive layer 132, semiconductor die 124 can meet the I/O requirements of the active and passive components of the die while minimizing the die size and grossing the maximum number of die per wafer 120.

In FIG. 4c, semiconductor die 124 are singulated using a cutting tool 134, such as a saw blade, water jet, or laser. The singulated semiconductor die are then separated using an expansion table 136 that moves in two-dimension lateral directions, as shown by arrows 138 in FIG. 4d, to expand the spacing and create greater physical separation between the semiconductor die, designated as peripheral region 140. FIG. 4e is a plan view of expansion table 136 moving substantially the same distance in the x-axis and y-axis by arrows 138 within the tolerance of the table control to increase width of peripheral region 140 and separation between semiconductor die 124. For example, the post-expansion width of peripheral region 140 between semiconductor die 124 can range from 500-1500 μm.

In another embodiment, continuing from FIG. 4c, semiconductor wafer 120 is singulated through saw streets 126 using cutting tool 134 into individual semiconductor die 124. FIG. 4f shows a temporary substrate or carrier 144 containing sacrificial base material such as silicon, polymer, beryllium oxide, or other suitable low-cost, rigid material for structural support. An interface layer or double-sided tape 146 is formed over carrier 144 as a temporary adhesive bonding film or etch-stop layer. Semiconductor die 124 are positioned over and mounted to interface layer 146 and carrier 144 using a pick and place operation with active surface 130 oriented toward the carrier. In particular, semiconductor die 124 are placed over carrier 144 with a physical separation designated as peripheral region 148. In one embodiment, the width of peripheral region 148 ranges from 0.2-5.0 mm.

FIG. 4g shows semiconductor die 124 mounted to carrier 144 to illustrate a portion of reconfigured or reconstituted wafer 150. A plurality of discrete electrical components 151 can be mounted to reconstituted wafer 150 substantially adjacent to semiconductor die 124. The discrete electrical components 151 include transistors, diodes, resistors, capacitors, inductors, and other active and passive devices.

In FIG. 4h, an encapsulant or molding compound 152 is deposited over semiconductor die 124 and carrier 144 and into peripheral region 148 using a paste printing, compression molding, transfer molding, liquid encapsulant molding, vacuum lamination, spin coating, or other suitable applicator. Encapsulant 152 can be polymer composite material, such as epoxy resin with filler, epoxy acrylate with filler, or polymer with proper filler. Encapsulant 152 is non-conductive and environmentally protects the semiconductor device from external elements and contaminants.

In another embodiment, an insulating or dielectric material 152 is formed over semiconductor die 124 and carrier 144 and into peripheral region 148 using PVD, CVD, printing, spin coating, spray coating, screen printing or lamination. The insulating layer 152 contains one or more layers of silicon dioxide (SiO2), silicon nitride (Si3N4), silicon oxynitride (SiOn), tantalum pentoxide (Ta2O5), aluminum oxide (Al2O3), benzocyclobutene (BCB), polyimide (PI), polybenzoxazoles (PBO), polymer, or other material having similar insulating and structural properties.

In FIG. 4i, a portion of encapsulant 152 is optionally removed by grinder 154 to planarize the encapsulant and expose back surface 128 of semiconductor die 124. FIG. 4j shows semiconductor die 124 after the back grinding process with encapsulant 152 disposed within peripheral region 148. FIG. 4k shows a plan view of reconstituted wafer 150 with encapsulant 152 disposed within peripheral region 148 around semiconductor die 124.

In FIG. 4l, carrier 144 and interface layer 146 are removed by chemical etching, mechanical peeling, CMP, mechanical grinding, thermal bake, UV light, laser scanning, or wet stripping to expose encapsulant 152, active surface 130, and conductive layer 132. Encapsulant 152 provides structural support for semiconductor die 124 after removal of carrier 144.

In FIG. 4m, an insulating or passivation layer 156 is formed over encapsulant 152 and semiconductor die 124 using PVD, CVD, printing, spin coating, spray coating, screen printing or lamination. The insulating layer 156 contains one or more layers of SiO2, Si3N4, SiOn, Ta2O5, Al2O3, BCB, PI, PBO, or other material having similar insulating and structural properties. A portion of insulating layer 156 is removed by an etching process with a patterned photoresist layer (not shown) to expose conductive layer 132. Alternatively, a portion of insulating layer 156 is removed by laser direct ablation (LDA) using laser 158 to expose conductive layer 132.

In FIG. 4n, an electrically conductive layer 160 is formed over insulating layer 156 and conductive layer 132 using patterning with PVD, CVD, sputtering, electrolytic plating, electroless plating process, or other suitable metal deposition process. Conductive layer 160 can be one or more layers of Al, Cu, Sn, Ni, Au, Ag, or other suitable electrically conductive material, including alloys thereof. A portion of conductive layer 160 extends horizontally along insulating layer 156 and parallel to active surface 130 of semiconductor die 124 to laterally redistribute the electrical interconnect to conductive layer 132. Conductive layer 160 operates as a fan-out redistribution layer (RDL) for the electrical signals of semiconductor die 124. A portion of conductive layer 160 is electrically connected to conductive layer 132. Other portions of conductive layer 160 are electrically common or electrically isolated depending on the connectivity of semiconductor die 124.

In FIG. 4o, an insulating or passivation layer 162 is formed over insulating layer 156 and conductive layer 160 using PVD, CVD, printing, spin coating, spray coating, screen printing or lamination. The insulating layer 162 can be one or more layers of SiO2, Si3N4, SiON, Ta2O5, Al2O3, BCB, PI, PBO, or other material having similar insulating and structural properties. A portion of insulating layer 162 is removed by an etching process with a patterned photoresist layer to expose conductive layer 160. Alternatively, a portion of insulating layer 162 is removed by LDA using laser 164 to expose conductive layer 160.

In FIG. 4p, an electrically conductive layer 166 is formed over insulating layer 162 and conductive layer 160 using patterning with PVD, CVD, sputtering, electrolytic plating, electroless plating process, or other suitable metal deposition process. Conductive layer 166 can be one or more layers of Al, Cu, Sn, Ni, Au, Ag, or other suitable electrically conductive material, including alloys thereof. In one embodiment, conductive layer 166 is a multi-metal stacked UBM layer with adhesion layer, barrier layer, and seed or wetting layer electrically connected to conductive layer 160. The adhesion layer is formed over insulating layer 162 and can be titanium (Ti), titanium nitride (TiN), titanium tungsten (TiW), Al, or chromium (Cr). The barrier layer is formed over the adhesion layer and can be Ni, nickel vanadium (NiV), platinum (Pt), palladium (Pd), TiW, or chromium copper (CrCu). The barrier layer inhibits the diffusion of Cu into the active area of the die. The seed layer is formed over the barrier layer and can be Cu, Ni, NiV, Au, or Al.

In FIG. 4q, an electrically conductive bump material is deposited over UBM layer 166 using an evaporation, electrolytic plating, electroless plating, ball drop, or screen printing process. The bump material can be Al, Sn, Ni, Au, Ag, Pb, Bi, Cu, solder, and combinations and alloys thereof, with an optional flux solution. For example, the bump material can be eutectic Sn/Pb, high-lead solder, or lead-free solder. The bump material is bonded to UBM layer 166 using a suitable attachment or bonding process. In one embodiment, the bump material is reflowed by heating the material above its melting point to form balls or bumps 168. In some applications, bumps 168 are reflowed a second time to improve electrical contact to UBM layer 166. Bumps 168 can also be compression bonded to UBM layer 166. Bumps 168 represent one type of interconnect structure that can be formed over UBM layer 166. The interconnect structure can also use stud bump, micro bump, or other electrical interconnect.

The combination of insulating layers 156 and 162, conductive layers 160 and 166, and bumps 168 constitute a fan-out interconnect structure 170 formed over semiconductor die 124 and encapsulant 152. Additional insulating layers and conductive layers can be formed in fan-out interconnect structure 170 for interconnection to semiconductor die 124. The mating surface of interconnect structure 170 has an I/O density less than an I/O density of conductive layer 132 on semiconductor die 124.

In FIG. 4r, the reconstituted wafer 150 is singulated through encapsulant 152 and fan-out interconnect structure 170 with saw blade or laser cutting tool 172 into individual fan-out extended semiconductor device 174.

Figure 5:
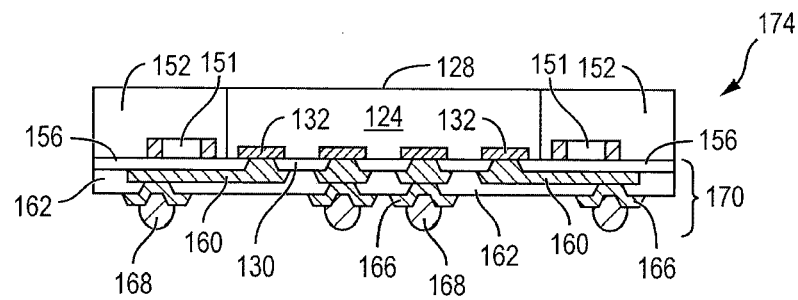
FIG. 5 illustrates the extended semiconductor device having a reduced layout density for the fan-out interconnect structure.

FIG. 5 shows the extended semiconductor device 174 with fan-out interconnect structure 170 after singulation. Conductive layer 132 of semiconductor die 124 is electrically connected to conductive layers 160 and 166 and bumps 168. The extended semiconductor device 174 is larger than semiconductor die 124 due to encapsulant 152 disposed in peripheral region 148. In one embodiment, extended semiconductor device 174, including semiconductor die 124 and encapsulant 152 formed around peripheral region 148, is 6.0×6.0 mm$^2$, given the 5.2×5.2 mm$^2$ semiconductor die. In other embodiments, extended semiconductor device 174 can be up to 50×50 mm$^2$.

Figure 6A:
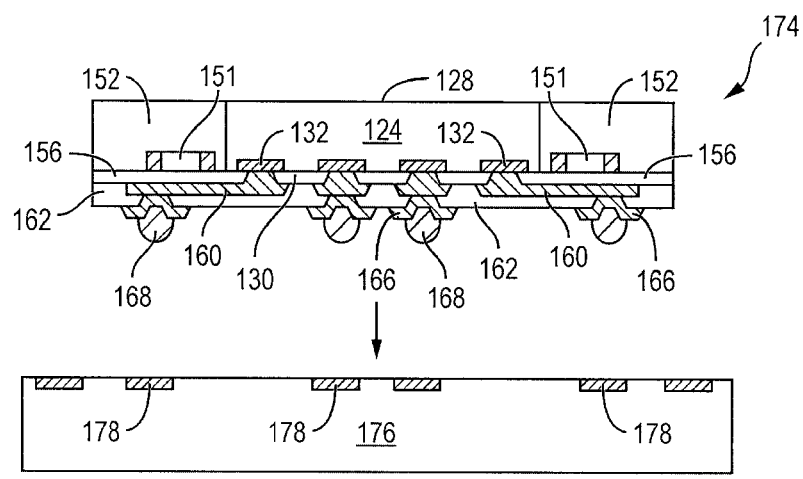
FIGS. 6a-6b illustrate the extended semiconductor device mounted to a substrate with reduced layout density.
Figure 6B:
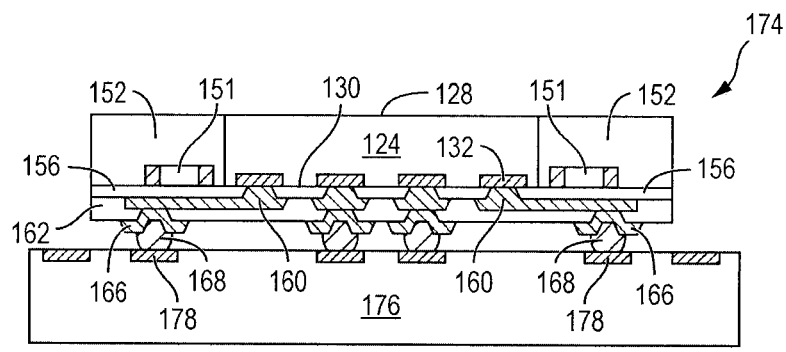

FIG. 6a shows extended semiconductor device 174 with fan-out interconnect structure 170 positioned over substrate 176 with bumps 168 aligned with conductive layer 178 formed on the substrate. Conductive layer 178 includes contact pads or trace lines for electrical interconnect through substrate 176. FIG. 6b shows extended semiconductor device 174 with bumps 168 metallurgically and electrically connected to conductive layer 178. The I/O density of conductive layer 178 is equal to or consistent with the I/O density of interconnect structure 170.

Figure 7:
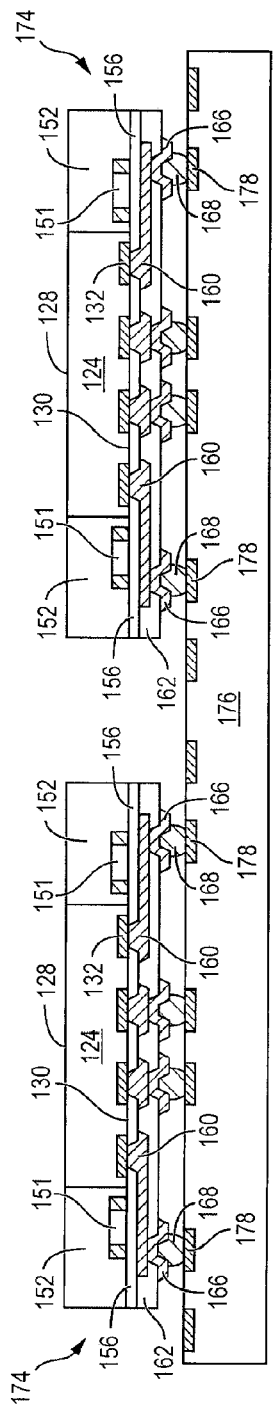
FIG. 7 illustrates two side-by-side extended semiconductor devices in accordance with FIGS. 6a-6b mounted to a substrate with reduced layout density.

FIG. 7 shows two side-by-side extended semiconductor devices 174 with fan-out interconnect structure 170 and bumps 168 metallurgically and electrically connected to conductive layer 178. The side-by-side extended semiconductor devices 174 on substrate 176 provide an alternative to 2.5D interposer integration.

Figure 8:
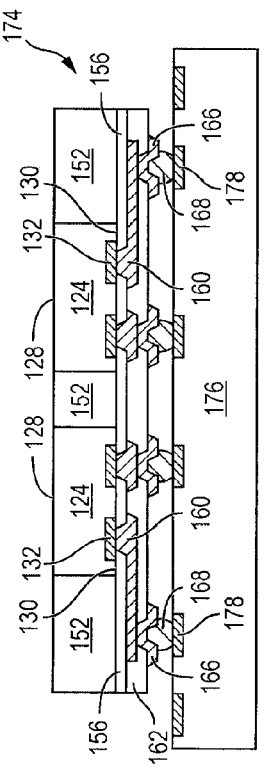
FIG. 8 illustrates two side-by-side semiconductor die in one extended semiconductor device.

FIG. 8 shows two side-by-side semiconductor die 124 in one extended semiconductor device 174 with fan-out interconnect structure 170 and bumps 168 metallurgically and electrically connected to conductive layer 178 of substrate 176.

As a feature of extended semiconductor device 174 with fan-out interconnect structure 170, bumps 168 are positioned with a relaxed layout design rule, as compared to the minimum pitch achievable for the manufacturing process used for conductive layer 132. That is, bumps 168 formed over fan-out interconnect structure 170 are spread out to have a lesser I/O density and larger pitch than the maximum I/O density and minimum pitch achievable for the manufacturing process. In one embodiment, bumps 168 are positioned with a pitch of 160 µm. Bumps 168 have the same I/O count as conductive layer 132, albeit with a lesser I/O density, to provide the interconnect for the active and passive components on semiconductor die 124. The lesser I/O density and larger pitch of bumps 168 reduces the layout requirements of substrate 176. In other words, the conductive layer 178 of substrate 176 does not have to meet the minimum pitch achievable for the manufacturing process design rules of conductive layer 132. Conductive layer 178 can be positioned with a larger pitch under the same relaxed layout design rule or consistent layout design rule used for conductive layer 160 and bumps 168 within fan-out interconnect structure 170. In one embodiment, conductive layer 178 has a pitch of 160 µm. The relaxed layout design rules for conductive layer 178 on substrate 176, achievable with fan-out interconnect structure 170, reduce I/O density and simplify routing for the substrate by providing design flexibility to the layout of the conductive layer on the substrate.

One of the advantages for extended semiconductor device 174 is lower cost. In many semiconductor manufacturing processes, the cost of forming the bump structure is about 15% of the total expense. The cost of the substrate is about 60% of the total expense and assembly is about 25% of the total expense. A significant portion of the cost of the substrate is driven by the I/O density and associated trace line pitch requirements of the semiconductor package. While the formation of extended semiconductor device 174 with fan-out interconnect structure 170 (see FIGS. 4a-4r) may add some cost to the manufacturing process, the savings for using extended semiconductor device 174 with fan-out interconnect structure 170 in conjunction with substrate 176 having the larger trace line pitch are significant. For example, the cost of substrate 176 with the larger trace line pitch is less than half of the cost for a substrate compatible with the minimum pitch achievable for the manufacturing process design rules of conductive layer 132, as described in FIG. 4b. The savings achieved with substrate 176 having the larger trace line pitch more than outweighs the possible additional cost of forming extended semiconductor device 174. In addition, the relaxed layout design rules for substrate 176 with the larger pitch provide greater flexibility in placing contact pads and traces lines 178.

The extended semiconductor device 174 with fan-out interconnect structure 170 allows many different semiconductor die 124, each with different I/O layout and density, to be used with a common substrate 176. The fan-out interconnect structure 170 translates the I/O layout and density of substantially any semiconductor die 124 to a common and uniform I/O layout and density for interconnect to conductive layer 178 of substrate 176. For example, a first semiconductor die 124 may have a given I/O layout and density. The fan-out interconnect structure 170 translates the I/O layout and density of the first die for interconnect to conductive layer 178 of substrate 176. A second semiconductor die 124 may have a higher I/O layout and density. The fan-out interconnect structure 170 translates the higher I/O layout and density of the second die for interconnect to the same conductive layer 178 of substrate 176 as the first die. Accordingly, fan-out interconnect structure 170 translates the I/O layout and density of different semiconductor die to a common and uniform I/O layout and density of substrate 176. The use of a common substrate reduces cost.

The extended semiconductor device 174 contains semiconductor material, e.g., silicon, and encapsulant material, e.g., epoxy resin, that exhibit composite properties of low modulus and high coefficient of thermal expansion (CTE). The composite CTE of extended semiconductor device 174 matches or is more closely aligned with the CTE of substrate 176 than semiconductor material alone. Accordingly, extended semiconductor device 174, as well as the electrical interconnect between extended semiconductor device 174 and substrate 176, is subjected to less stress during thermal cycling.

Another advantage of extended semiconductor device 174 is that discrete electrical components 151 can be placed substantially adjacent to semiconductor die 124 while maintaining sufficient separation to negate the effects of parasitic impedance due to encapsulant 152 formed in peripheral region 148.

Figure 9A:
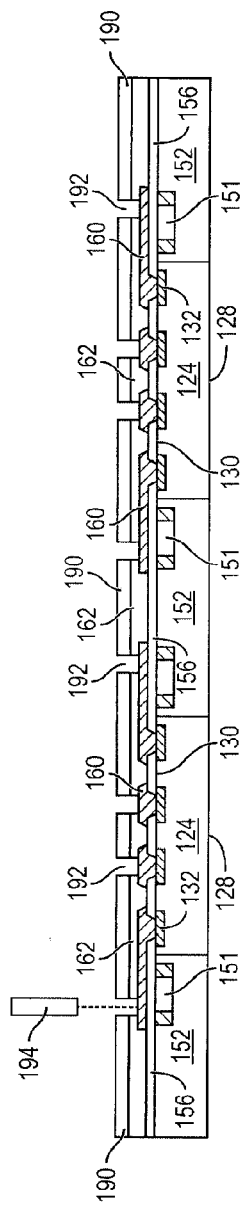
FIGS. 9a-9d illustrate a process of forming an extended semiconductor device with conductive columns and fan-out interconnect structure.

FIGS. 9a-9d illustrate, in relation to FIGS. 2 and 3a-3c, forming an extended semiconductor device with conductive columns and fan-out interconnect structure to reduce complexity of a substrate. Continuing from FIG. 4o, a patterning or photoresist layer 190 is formed over insulating layer 162 and conductive layer 160 using printing, spin coating, or spray coating, as shown in FIG. 9a. In some embodiments that utilize an insulating layer for patterning, the insulating layer can include one or more layers of SiO2, Si3N4, SiON, Ta2O5, Al2O3, or other material having similar structural properties. A portion of photoresist layer 190 is removed by an etching process to form vias 192 that extend down to and expose conductive layer 160. Alternatively, vias 192 are formed by LDA using laser 194.

Figure 9B:
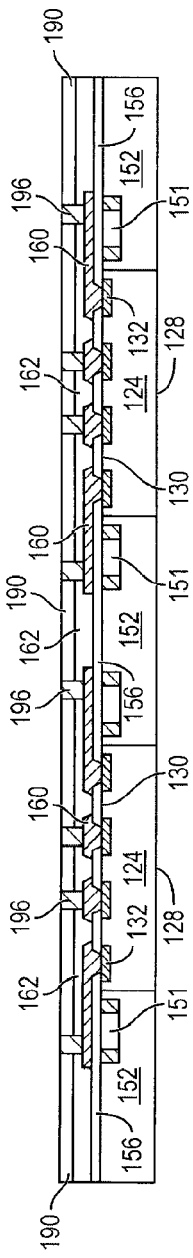

In FIG. 9b, an electrically conductive material is deposited into vias 192 over conductive layer 160 using a patterning and metal deposition process such as printing, sputtering, electrolytic plating, and electroless plating to form conductive columns 196. The conductive material can be one or more layers of Al, Cu, Sn, Ti, Ni, Au, Ag, W, or other suitable electrically conductive material, including alloys thereof. Conductive columns 196 are electrically connected to conductive layer 160.

Figure 9C:
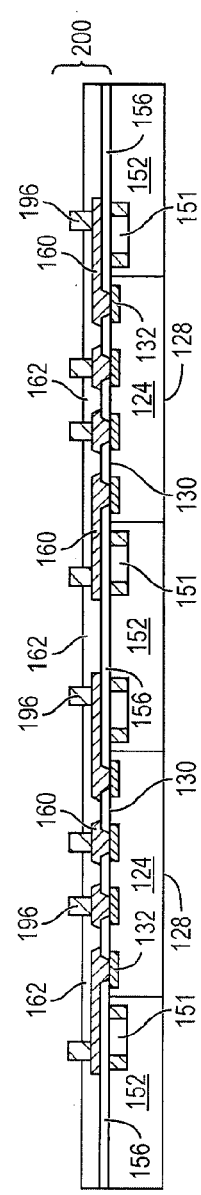

In FIG. 9c, the remaining portions of photoresist layers 190 are removed by a chemical stripping process to expose insulating layer 162 and a portion of conductive columns 196. In one embodiment, the height of conductive columns 196 is 20-45 µm.

Figure 9D:
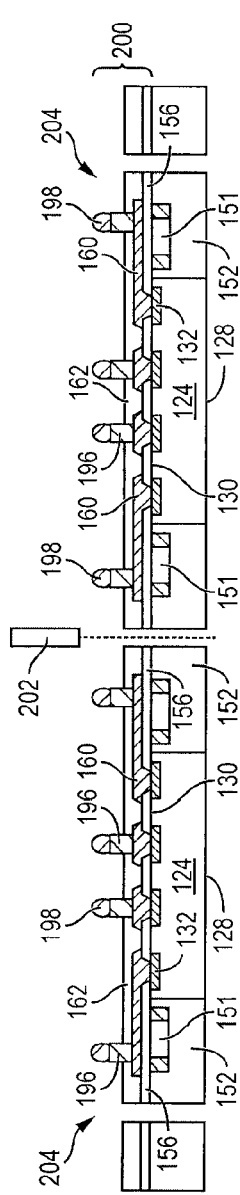

In FIG. 9d, an electrically conductive bump material is deposited over conductive columns 196 using an evaporation, electrolytic plating, electroless plating, ball drop, or screen printing process. The bump material can be Al, Sn, Ni, Au, Ag, Pb, Bi, Cu, solder, and combinations and alloys thereof, with an optional flux solution. For example, the bump material can be eutectic Sn/Pb, high-lead solder, or lead-free solder. The bump material can be formed over conductive columns 196. Alternatively, the bump material can be bonded to conductive columns 196 using a suitable attachment or bonding process. In one embodiment, the conductive bump material is reflowed by heating the material above its melting point to form balls or bumps 198. In some applications, bumps 198 are reflowed a second time to improve electrical contact to conductive columns 196.

The conductive columns 196 and bumps 198 can be formed by other manufacturing processes. For example, a non-fusible conductive column 196, such as Cu, can be formed over conductive layer 132 or conductive layer 160. A fusible bump 198 is formed over non-fusible conductive column 196 without the need for an insulating material to inhibit the flow of fusible material down the conductive column.

The combination of insulating layers 156 and 162, conductive layer 160, conductive columns 196, and bumps 198 constitute a fan-out interconnect structure 200 formed over semiconductor die 124 and encapsulant 152. Additional insulating layers and RDLs can be formed in fan-out interconnect structure 200 for interconnection to semiconductor die 124. The mating surface of interconnect structure 200 has an I/O density less than an I/O density of conductive layer 132 on semiconductor die 124.

The reconstituted wafer is singulated through encapsulant 152 and fan-out interconnect structure 200 with saw blade or laser cutting tool 202 into individual extended semiconductor devices 204 with fan-out interconnect structure 200.

Figure 10:
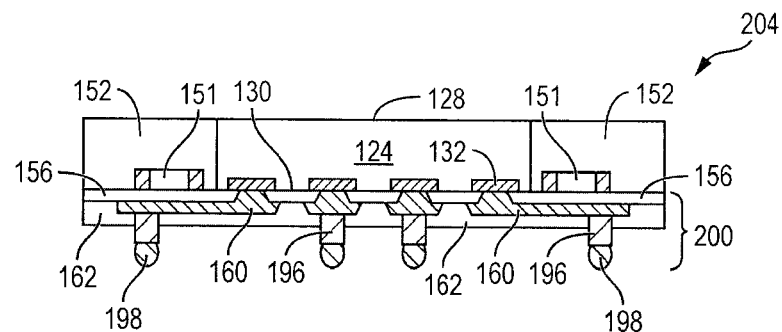
FIG. 10 illustrates the extended semiconductor device with conductive columns and fan-out interconnect structure.

FIG. 10 shows the extended semiconductor device 204 with fan-out interconnect structure 200 after singulation. Conductive layer 132 of semiconductor die 124 is electrically connected to conductive layer 160, conductive columns 196, and bumps 198. The extended semiconductor device 204 is larger than semiconductor die 124 due to encapsulant 152 disposed in peripheral region 148. In one embodiment, extended semiconductor device 204 is 6.0×6.0 mm², given the 5.2×5.2 mm² semiconductor die. In other embodiments, extended semiconductor device 204 can be up to 50×50 mm².

Figure 11A:
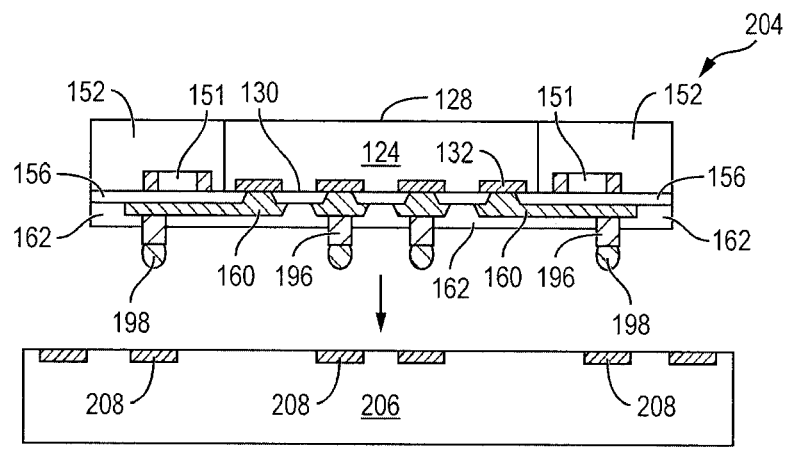
FIGS. 11a-11b illustrate the extended semiconductor device with conductive columns and interconnect structure mounted to a substrate with reduced layout density.
Figure 11B:
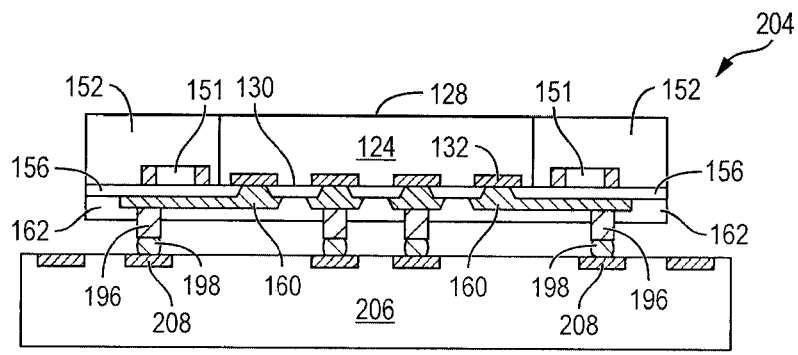

FIG. 11a shows extended semiconductor device 204 with fan-out interconnect structure 200 positioned over substrate 206 with bumps 198 aligned with conductive layer 208 formed on the substrate. Conductive layer 208 includes contact pads and trace lines for electrical interconnect through substrate 206. FIG. 11b shows extended semiconductor device 204 mounted to substrate 206 with bumps metallurgically and electrically connected to conductive layer 208. The I/O density of conductive layer 208 is equal to or consistent with the I/O density of interconnect structure 200.

Figure 12:
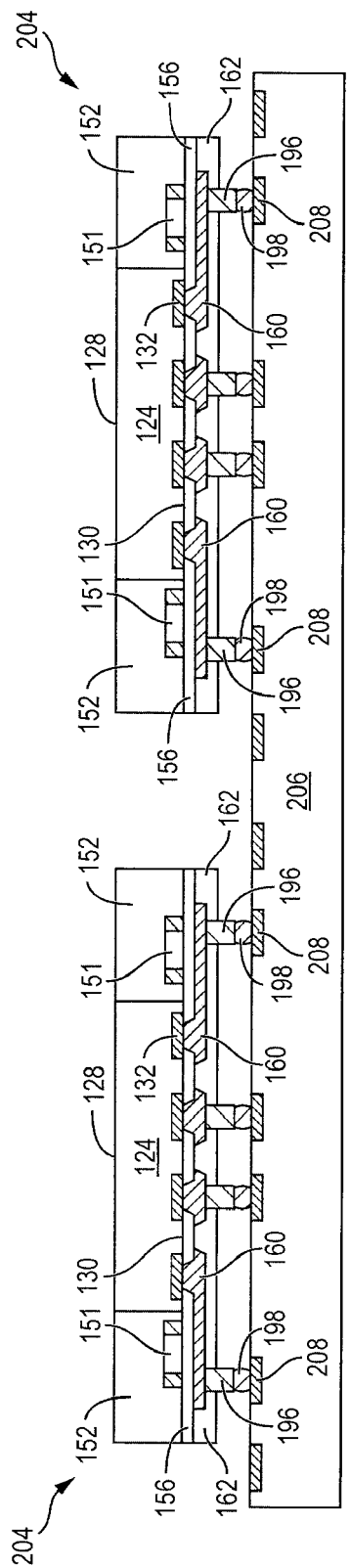
FIG. 12 illustrates two side-by-side extended semiconductor device in accordance with FIGS. 10a-10b mounted to a substrate with reduced layout density.

FIG. 12 shows two side-by-side extended semiconductor devices 204 with bumps 168 metallurgically and electrically connected to conductive layer 178. The side-by-side extended semiconductor devices 174 on substrate 176 provide an alternative to 2.5D interposer integration.

Figure 13:
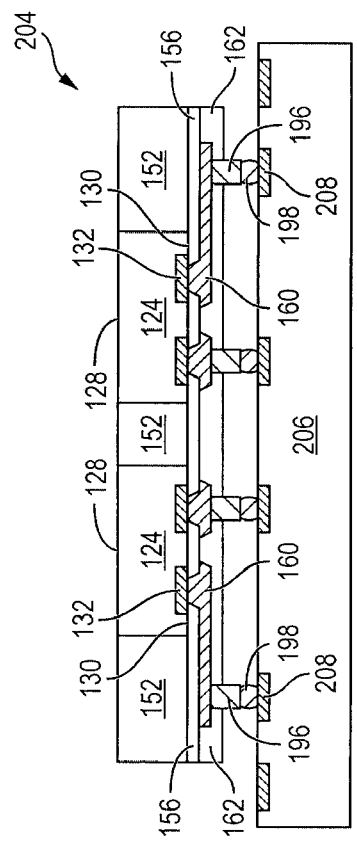
FIG. 13 illustrates two side-by-side semiconductor die in one extended semiconductor device.

FIG. 13 shows two side-by-side semiconductor die 124 in one extended semiconductor device 204 with fan-out interconnect structure 200 and bumps 198 metallurgically and electrically connected to conductive layer 178 of substrate 176.

As a feature of extended semiconductor device 204 with fan-out interconnect structure 200, bumps 208 are positioned with a relaxed layout design rule, as compared to the minimum pitch achievable for the manufacturing process used for conductive layer 132. That is, bumps 208 formed over fan-out interconnect structure 200 are spread out to have a lesser I/O density and larger pitch than the maximum I/O density and minimum pitch achievable for the manufacturing process. In one embodiment, bumps 208 are positioned with a pitch of 160 μm. Bumps 208 have the same I/O count as conductive layer 132, albeit with a lesser I/O density, to provide the interconnect for the active and passive components on semiconductor die 124. The lesser I/O density and larger pitch of bumps 208 reduces the layout requirements of substrate 206. In other words, the conductive layer 208 of substrate 206 does not have to meet the minimum pitch achievable for the manufacturing process design rules of conductive layer 132. Conductive layer 208 can be positioned with a larger pitch under the same relaxed layout design rule or consistent layout design rule used for conductive layer 160 and bumps 208 within fan-out interconnect structure 200. In one embodiment, conductive layer 208 has a pitch of 160 μm. The relaxed layout design rules for conductive layer 208 on substrate 206, achievable with fan-out interconnect structure 200, reduce I/O density and simplify routing for the substrate by providing design flexibility to the layout of the conductive layer on the substrate.

One of the advantages for extended semiconductor device 204 is lower cost. In many semiconductor manufacturing processes, the cost of forming the bump structure is about 15% of the total expense. The cost of the substrate is about 60% of the total expense and assembly is about 25% of the total expense. A significant portion of the cost of the substrate is driven by the I/O density and associated trace line pitch requirements of the semiconductor package. While the formation of extended semiconductor device 204 with fan-out interconnect structure 200 may add some cost to the manufacturing process, the savings for using extended semiconductor device 204 with fan-out interconnect structure 200 in conjunction with substrate 206 having the larger trace line pitch are significant. For example, the cost of substrate 206 with the larger trace line pitch is less than half of the cost for a substrate compatible with the minimum pitch achievable for the manufacturing process design rules of conductive layer 132, as described in FIG. 4b. The savings achieved with substrate 206 having the larger trace line pitch more than outweighs the possible additional cost of forming extended semiconductor device 204. In addition, the relaxed layout design rules for substrate 206 with the larger pitch provide greater flexibility in placing contact pads and traces lines 208.

The extended semiconductor device 204 with fan-out interconnect structure 200 allows many different semiconductor die 124, each with different I/O layout and density, to be used with a common substrate 206. The fan-out interconnect structure 200 translates the I/O layout and density of substantially any semiconductor die 124 to a common and uniform I/O layout and density for interconnect to conductive layer 208 of substrate 206. For example, a first semiconductor die 124 may have a given I/O layout and density. The fan-out interconnect structure 200 translates the I/O layout and density of the first die for interconnect to conductive layer 208 of substrate 206. A second semiconductor die 124 may have a higher I/O layout and density. The fan-out interconnect structure 200 translates the higher I/O layout and density of the second die for interconnect to the same conductive layer 208 of substrate 206 as the first die. Accordingly, fan-out interconnect structure 200 translates the I/O layout and density of different semiconductor die to a common and uniform I/O layout and density of substrate 206. The use of a common substrate reduces cost.

The extended semiconductor device 204 contains semiconductor material, e.g., silicon, and encapsulant material, e.g., epoxy resin, that exhibit composite properties of low modulus and high CTE. The composite CTE of extended semiconductor device 204 matches or is more closely aligned with the CTE of substrate 206 than semiconductor material alone. Accordingly, extended semiconductor device 204, as well as the electrical interconnect between extended semiconductor device 204 and substrate 206, is subjected to less stress during thermal cycling.

Another advantage of extended semiconductor device 204 is that discrete electrical components 151 can be placed substantially adjacent to semiconductor die 124 while maintaining sufficient separation to negate the effects of parasitic impedance due to encapsulant 152 formed in peripheral region 148.

Figure 14:
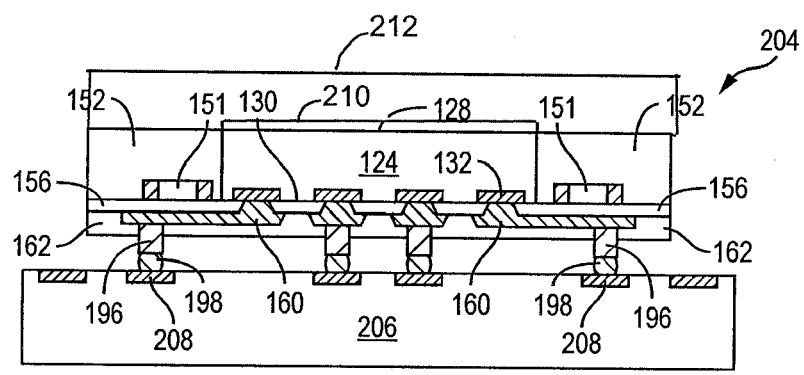
FIG. 14 illustrates a heat sink formed over the extended semiconductor device.

FIG. 14 shows a thermal interface material (TIM) 210 deposited over back surface 128 of semiconductor die 124. TIM 210 is a thermal epoxy, thermal epoxy resin, or thermal conductive paste. A heat sink or heat spreader 212 is mounted to or formed over TIM 210 and encapsulant 152. Heat spreader 212 can be Cu, Al, or other material with high thermal conductivity. Heat spreader 212 and TIM 210 form a thermally conductive path that distributes and dissipates the heat generated by the high frequency electronic components of semiconductor die 124 and increases the thermal performance of extended semiconductor device 204. The heat is dissipated radially from heat spreader 204.

In each of the above examples, a fan-out ratio exists between the semiconductor die and substrate. The fan-out ratio for a tier is the I/O density (I/O per unit area) of a first device to the I/O density to a second device electrically connected to the first device. In FIGS. 6a-6b and 11a-11b, the fan-out ratio is the I/O density of the semiconductor die 124 to the I/O density of substrate 176 or 206. In one embodiment, the I/O density of semiconductor die 124 is 30 I/O per mm², and the I/O density of substrate 176 is 10 I/O per mm², giving a fan-out ratio of 30/10=3.

As a general principle embodied in extended semiconductor devices 174 and 204, an I/O density conversion structure is positioned between the higher I/O tier (semiconductor die 124) and lower I/O tier (substrate 176 or 206) to efficiently downconvert the I/O density in order to simplify the layout requirements of the lower I/O tier. In general, a fan-out ratio (FR) for a tier can be defined in equation (1) as:

$$FR = (\text{input } I/O \text{ density})/(\text{ouput } I/O \text{ density}) \quad (1)$$
$$= p^2 * (N/d^2)$$

where:
d=die size
p=package pitch
N=number of non-redundant I/O on die

Figure 15:
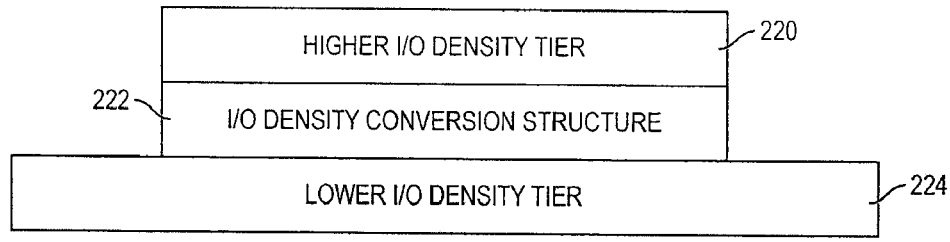
FIG. 15 illustrates a higher I/O density tier converted to a lower I/O density tier with an I/O density conversion structure.

FIG. 15 shows a higher I/O density tier 220, e.g., semiconductor die 124, electrically connected to an I/O density conversion structure 222, e.g., fan-out interconnect structure 170 or 200. The I/O density conversion structure 222 is electrically connected to the lower I/O tier 224, e.g., substrate 176 or 206.

The I/O density conversion can apply to any level of semiconductor manufacturing. For example, the higher I/O density tier 220 could be substrate 176 or 206 and the lower I/O density tier 224 could be a PCB, see FIG. 2. As the fan-out ratio exceeds 10, e.g. for silicon die, the layout and interconnect rules become economically inefficient. A fan-out ratio between 2 and 10 is considered economical for most semiconductor tiers. In one embodiment, the I/O density of substrate 176 or 206 is 10 I/O per mm$^2$, and the I/O density of the PCB is 4 I/O per mm$^2$, giving a fan-out ratio of 10/4=2.5. The I/O density conversion structure 222 relaxes layout design rules for the PCB conductive layers to reduce I/O density and simplify routing for the lower I/O density tier 223 to reduce cost.

Figure 16A:
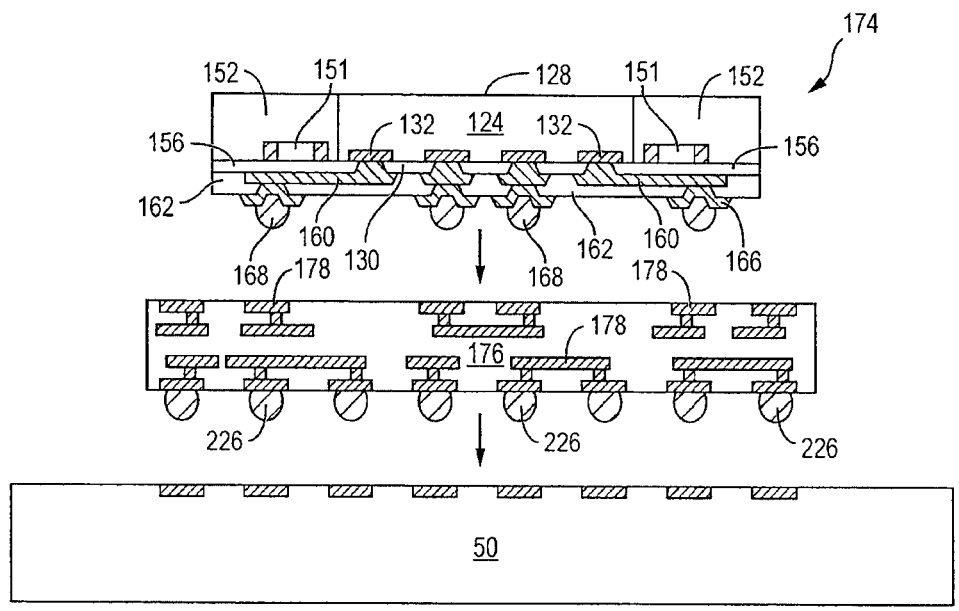
FIGS. 16a-16b illustrate multiple tier semiconductor devices and structures, each with a different I/O density.
Figure 16B:
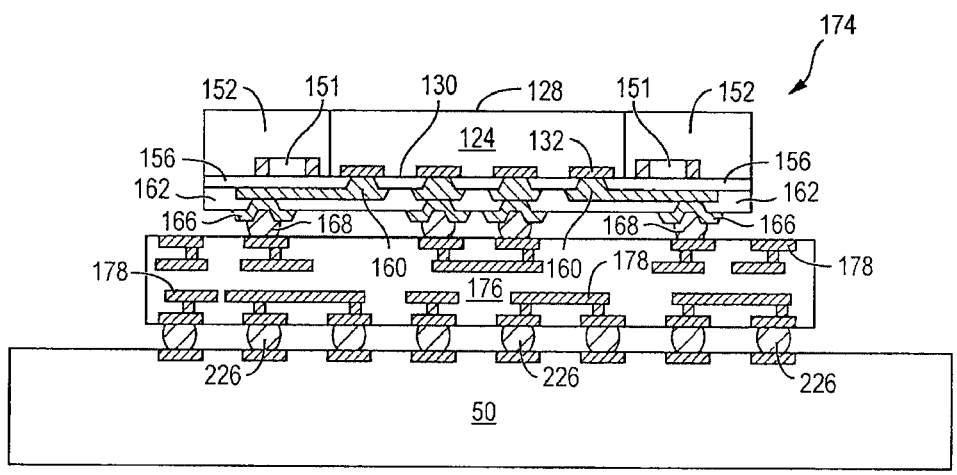

FIG. 16a shows extended semiconductor device 174 with fan-out interconnect structure 170 positioned over for mounting to substrate 176. Substrate 176 with bumps 226 is positioned over for mounting to PCB 50. FIG. 16b shows semiconductor device 174 mounted to substrate 176 and substrate 176 mounted to PCB 50. The higher I/O density of semiconductor die 124 is translated through fan-out interconnect structure 170 to the lower I/O density of substrate 176. Likewise, substrate 176 can translate its I/O density to a lower I/O density of PCB 50. In each case, the I/O density conversion structure between each tier relaxes layout design rules for the lower tier conductive layers to reduce I/O density and simplify routing for the lower I/O density tier to reduce cost.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a first semiconductor die;
   an insulating material deposited in a peripheral region around the first semiconductor die;
   an interconnect structure formed over the first semiconductor die and including,
   (a) a first conductive layer extending from a contact pad of the first semiconductor die over a surface of the insulating material, and
   (b) a plurality of bumps formed over the first conductive layer; and
   a substrate including a second conductive layer, wherein the first semiconductor die is mounted to the substrate with the bumps contacting the second conductive layer and a fan-out ratio (FR) of an I/O density of the first semiconductor die to an I/O density of the substrate is given as FR=$p^2$*(N/$d^2$), where p is package pitch, N is number of non-redundant I/O per die, and d is die size.

2. The semiconductor device of claim 1, wherein the I/O density of the substrate is less than the I/O density of the first semiconductor die.

3. The semiconductor device of claim 1, wherein the interconnect structure further includes a plurality of conductive columns formed between the bumps and first conductive layer.

4. The semiconductor device of claim 1, further including a second semiconductor die disposed over the interconnect structure adjacent to the first semiconductor die.

5. The semiconductor device of claim 4, wherein an I/O density of the second semiconductor die is greater than the I/O density of the first semiconductor die.

6. The semiconductor device of claim 1, wherein the surface of the insulating material is coplanar with an active surface of the first semiconductor die.

7. A semiconductor device, comprising:
   a first semiconductor die;
   an insulating material disposed in a peripheral region around the first semiconductor die;
   a first input/output (I/O) density conversion structure formed over the first semiconductor die and including,
   (a) a conductive layer formed over the first semiconductor die and a surface of the insulating material, and
   (b) a plurality of interconnect structures formed over the conductive layer and surface of the insulating material; and
   a second I/O density conversion structure disposed over the first I/O density conversion structure, wherein the first I/O density conversion structure translates an I/O density of the first semiconductor die to a second I/O density and the second I/O density conversion structure translates the second I/O density to a third I/O density, wherein a fan-out ratio (FR) of the first I/O density to the second I/O density is given as FR=$p^2$*(N/$d^2$), where p is package pitch, N is number of non-redundant I/O per die, and d is die size.

8. The semiconductor device of claim 7, further including a second semiconductor die disposed over the second I/O density conversion structure.

9. The semiconductor device of claim 7, wherein the plurality of interconnect structures includes a conductive column.

10. The semiconductor device of claim 7, further including a second semiconductor die disposed over the first I/O density conversion structure.

11. The semiconductor device of claim 10, wherein the second semiconductor die includes an I/O density different from the I/O density of the first semiconductor die.

12. The semiconductor device of claim 7, further including a discrete component disposed adjacent to the first semiconductor die.

13. The semiconductor device of claim 7, wherein the FR is less than or equal to 10.

14. The semiconductor device of claim 7, wherein the surface of the insulating material is coplanar with an active surface of the first semiconductor die.

15. A semiconductor device, comprising:
- a first semiconductor die;
- a second semiconductor die, wherein a first I/O density of the first semiconductor die is different from a second I/O density of the second semiconductor die;
- an insulating material disposed in a peripheral region around the first semiconductor die and second semiconductor die;
- a first input/output (I/O) density conversion structure disposed over the first semiconductor die and second semiconductor die and including,
  - (a) a conductive layer formed over the first semiconductor die and second semiconductor die and insulating material, and
  - (b) a plurality of interconnect structures formed over the conductive layer and insulating material, wherein the first I/O density conversion structure translates the first I/O density of the first semiconductor die and the second I/O density of the second semiconductor die to a third I/O density; and
- a second I/O density conversion structure disposed over the first I/O density conversion structure, wherein the second I/O density conversion structure translates the third I/O density to a fourth I/O density, wherein a fan-out ratio (FR) of the third I/O density to the fourth I/O density is given as $FR=p^2*(N/d^2)$, where p is package pitch, N is number of non-redundant I/O per die, and d is die size.

16. The semiconductor device of claim 15, wherein the plurality of interconnect structures includes:
- a conductive column; and
- a bump formed over the conductive column.

17. The semiconductor device of claim 15, wherein the FR is less than or equal to 10.

* * * * *